United States Patent
Jones et al.

(10) Patent No.: US 6,621,259 B2
(45) Date of Patent: Sep. 16, 2003

(54) CURRENT SENSE AMPLIFIER AND METHOD

(75) Inventors: David M. Jones, Tucson, AZ (US); Heinz-Juergen Metzger, Pliezhausen (DE)

(73) Assignee: Texas Instruments Incorporated, Dallas, TX (US)

(*) Notice: Subject to any disclaimer, the term of this patent is extended or adjusted under 35 U.S.C. 154(b) by 213 days.

(21) Appl. No.: 09/870,316

(22) Filed: May 30, 2001

(65) Prior Publication Data

US 2002/0180418 A1 Dec. 5, 2002

(51) Int. Cl.[7] .............................. H03F 3/45; G01R 19/00
(52) U.S. Cl. ...................... 324/123 C; 327/53; 327/54; 330/257
(58) Field of Search ................................. 324/118, 119, 324/120, 158.1, 123 C; 327/50–57; 330/257, 260

(56) References Cited

U.S. PATENT DOCUMENTS

| 5,498,984 A | 3/1996 | Schaffer | 327/51 |
| 5,585,746 A * | 12/1996 | Franke | 327/54 |
| 5,627,494 A * | 5/1997 | Somerville | 330/257 |

OTHER PUBLICATIONS

Linear Technology Data Sheet for LT1490/LT1491, Dual and Quad Micropower Rail–to–Rail Input and Output Op Amps, Copyright 1996,97 Linear Technology, pp. 1–2.

* cited by examiner

*Primary Examiner*—Vinh P. Nguyen
(74) *Attorney, Agent, or Firm*—W. Daniel Swayze, Jr.; W. James Brady; Frederick J. Telecky, Jr.

(57) ABSTRACT

A current sense amplifier (10) for measuring current flowing through a sense resistor (12) coupled between first (11) and second (13) terminals, respectively, of the current sense amplifier, the current sense amplifier includes a first amplifier (18) having a first input (17) coupled by a first resistor (16) to the first terminal (11) and a second input (20) coupled by a second resistor (19) to the second terminal (13) and a bias circuit (30,24) coupled to the first input (17) of the first amplifier for causing the bias current to flow through the first resistor (16. A feedback transistor (26) is coupled to the output (22) of the first amplifier and the second input (20) of the first amplifier to cause a feedback current to equalize the voltages on the first (17) and second (20) inputs of the first amplifier and supply the feedback current to an output terminal (36) of the current sense amplifier (10).

29 Claims, 2 Drawing Sheets

CURRENT SENSE AMPLIFIER AND METHOD

BACKGROUND OF THE INVENTION

The invention relates to circuits for measuring bi-directional currents across a current sense element, and more particularly to a simplified circuit for measuring bi-directional currents across a current sense element.

Current sense amplifiers, sometimes referred to as current shunt amplifiers, are typically used to measure the amount of current supplied by a power supply or battery to various types of electronic equipment, and also to measure the amount of current supplied by the electronic equipment back to the power supply. Several conventional approaches to the implementation of current sense amplifiers are known, including single polarity, low-side current sense amplifiers, low-side current sense amplifiers with bi-polar sensing, high-side switching current sense amplifiers, and bi-polar, high-side current sense amplifiers which detect the magnitude and polarity of current flowing from one device to another. These are disclosed in U.S. Pat. No. 5,498,984 entitled "High Side, Current Sense Amplifier Using a Symmetric Amplifier" issued Mar. 12, 1996 to Schaffer, which is believed to be the closest prior art.

FIG. 3 of the Schaffer patent shows a high-side current sense amplifier circuit in which a reference voltage $V_{REF}$ is connected to produce an offset voltage shift on the (−) input of the operational amplifier. This allows the amplitude and direction or polarity of the voltage drop across $R_{SENSE}$ for current flow through $R_{SENSE}$ in either direction to be indicated by means of a single voltage $V_{OUT}$ on a single output terminal. However, the current sense amplifier in FIG. 3 of the Schaffer patent requires that the operational amplifier be powered by the same supply voltage applied by the battery to the load. For example, if the battery output voltage is +12 volts, the $+V_{DD}$ supply voltage applied to the operational amplifier could not be +5 volts, because for most operational amplifiers it would not be permissible to apply a voltage greater than the $+V_{DD}$ supply voltage to the (−) input of the operational amplifier.

In FIG. 5 of the Schaffer patent, the disclosed bi-polar, high-side current sense amplifier has a symmetric architecture, and includes two sense inputs and two outputs. One output is active for positive input signals corresponding to current flowing from a battery through the sense resistor to a load. The other output is active for negative input signals corresponding to current flow in an opposite direction through the sense resistor. The two outputs are logically ORed to provide only one of the two outputs at a time. The operational amplifiers are powered by the same $V_{CC}$ voltage applied on conductor 54 to the load 46. The $V_{CC}$ voltage does not have to be equal to the battery voltage, because the input stages of the operational amplifiers 48 and 49 are constructed so that the common mode input voltage can exceed the $V_{CC}$ voltage. The circuit described in the Schaffer patent requires two output terminals, one for indicating the magnitude of the current through the current sense resistor and the other for indicating the direction of current in the current sense resistor.

An important shortcoming of the circuit disclosed in FIG. 5 of the Schaffer patent is that it is very inaccurate for very low currents through sense resistor 42. This is because for such very low currents, the voltage differential across sense resistor 42 is so small that the current flowing through either resistor RS1 and transistor Q1 or resistor RS2 and transistor Q2 is also very small, and that causes the feedback from the output 58 to the (+) input of the associated operational amplifier 48 or 49 to be very low. The low or reduced feedback results in low loop gain, and prevents the operational amplifier 48 or 49 from accurately producing the signal $I_{OUT}$ in conductor 58 if the current through the sense resistor 42 is very small. For example, if transistor Q2 in FIG. 5 of the Schaffer is on, but the shunt current through sense resistor 42 is nearly zero, then feedback causes the output of operational amplifier 49 to attempt to go all the way to ground in order to turn off transistor Q2. However, as a practical matter, operational amplifier 49 is incapable of driving its output all the way to ground. By turning transistor Q2 nearly off, the normal low-impedance feedback loop from the output 58 to the (+) input of operational amplifier 49 becomes a slow, high-impedance feedback loop. That is what results in a dramatic increase of the amount of error in the value of $I_{OUT}$ representing the magnitude of the very low (nearly zero) shunt current through sense resistor 42.

Furthermore, if the current flowing between battery 44 and load 46 is very small, the voltage across sense resistor 42 may be significantly lower than the algebraic sum of the offset voltages of operational amplifiers 48 and 49. For that reason, and also for the reason that the amplifier 18 is very inaccurate for low sense resistor currents, the determination of the direction of the sense resistor current by operational amplifier 56 is very uncertain over a considerable range of low currents through sense resistor 42.

Thus, for low sense currents, the circuit disclosed in the Schaffer patent is incapable of accurately determining either the magnitude or the direction of the current flowing through the sense resistor.

Furthermore, the circuit described in the Schaffer patent requires use of two operational amplifiers and a comparator, and therefore is more complex and costly and dissipates more power than desirable.

Thus, there has been a long-standing unmet need for an improved, less costly, more accurate current sense amplifier which (1) provides a high degree of accuracy in measurement of the magnitude of the current flowing through a current shunt element and also provides a high degree of certainty of the direction of the current, and (2) also provides a single signal which accurately represents both the amplitude and polarity or direction of a current flowing through the current shunt element.

SUMMARY OF THE INVENTION

Accordingly, it is an object of the invention to provide a current sense amplifier which is more accurate and less expensive than the closest prior art, and provides a single output signal indicative of both amplitude and direction of current through the sense resistor or the like.

It is another object of the invention to provide a high-side current sense amplifier which is more accurate and less expensive than the closest prior art, and provides a single output signal indicative of both amplitude and direction of current through the sense resistor or the like.

It is another object of the invention to provide a technique for using a current sense amplifier and an analog-to-digital converter in such a way as to avoid the effect of drift of a reference voltage on a reference-dependent offset voltage component of an output of the current sense amplifier.

It is another object of the invention to provide a current sense amplifier which is especially useful in providing a single analog output signal to an analog-to-digital converter to enable it to produce a digital output signal accurately representing both magnitude and direction of current flowing through a current shunt element.

It is another object of the invention to provide a current sense amplifier which is especially useful in measuring the amount of current in a feedback loop and providing a digital signal useful for controlling the feedback loop.

Briefly described, and in accordance with one embodiment, the invention provides a current sense amplifier (10) for measuring current flowing through a sense resistor (12) coupled between first (11) and second (13) terminals, respectively, of the current sense amplifier. The current sense amplifier includes a first amplifier (18) having a first input (17) coupled by a first resistor (16) to the first terminal (11) and a second input (20) coupled by a second resistor (19) to the second terminal (13). A current source circuit (23) is coupled to the first input (17) of the first amplifier to cause a bias current to flow through the first resistor (16). A feedback circuit (26) is coupled to the output (22) of the first amplifier and the second input (20) of the first amplifier to cause a feedback current to flow through the second resistor (19) to equalize the voltages on the first (17) and second (20) inputs of the first amplifier and also to supply the feedback current to an output terminal (36) of the current sense amplifier (10).

In the described embodiment, the first terminal (11) is coupled to an electronic/electrical load device or electronically/electrically controlled load device (15) and the second terminal (13) is coupled to a voltage source (14) or battery which supplies the current through the sense resistor (12) to the load device (15). The feedback circuit includes a first transistor (26) having a control electrode coupled to the output of the first amplifier (18), a first electrode coupled to the second input (20), and a second electrode coupled to the output terminal (36). The first transistor supplies the feedback current through the output terminal (36) into an output resistor (40) having a first terminal connected to the output terminal (36) and a second terminal connected to the first reference voltage conductor (9) to produce an output voltage ($V_{OUT}$) on the output terminal (36). The current source circuit 23 can include a second amplifier (30) having a first terminal coupled to a reference voltage ($V_{REF}$), an output (28) coupled a control electrode of a second transistor (24), a first electrode coupled to the first input (17) of the first amplifier (18), and a second electrode coupled to a second input of the second amplifier (30) and to a current setting resistor (38).

The output terminal (36) can be connected to a first input of an analog-to-digital converter (42) having an output for conducting a single digital output signal representative of the amplitude and direction of the current flowing through the sense resistor (12). A second input of the analog-to-digital converter can be connected to the reference voltage. A battery charger (46) can be coupled to the first terminal (11) to produce a charging current flowing through the current sense resistor (12) in the direction opposite to the flow of current supplied by the voltage source to the load device (15).

DETAILED DESCRIPTION OF THE PREFERRED EMBODIMENTS

Figure 1:
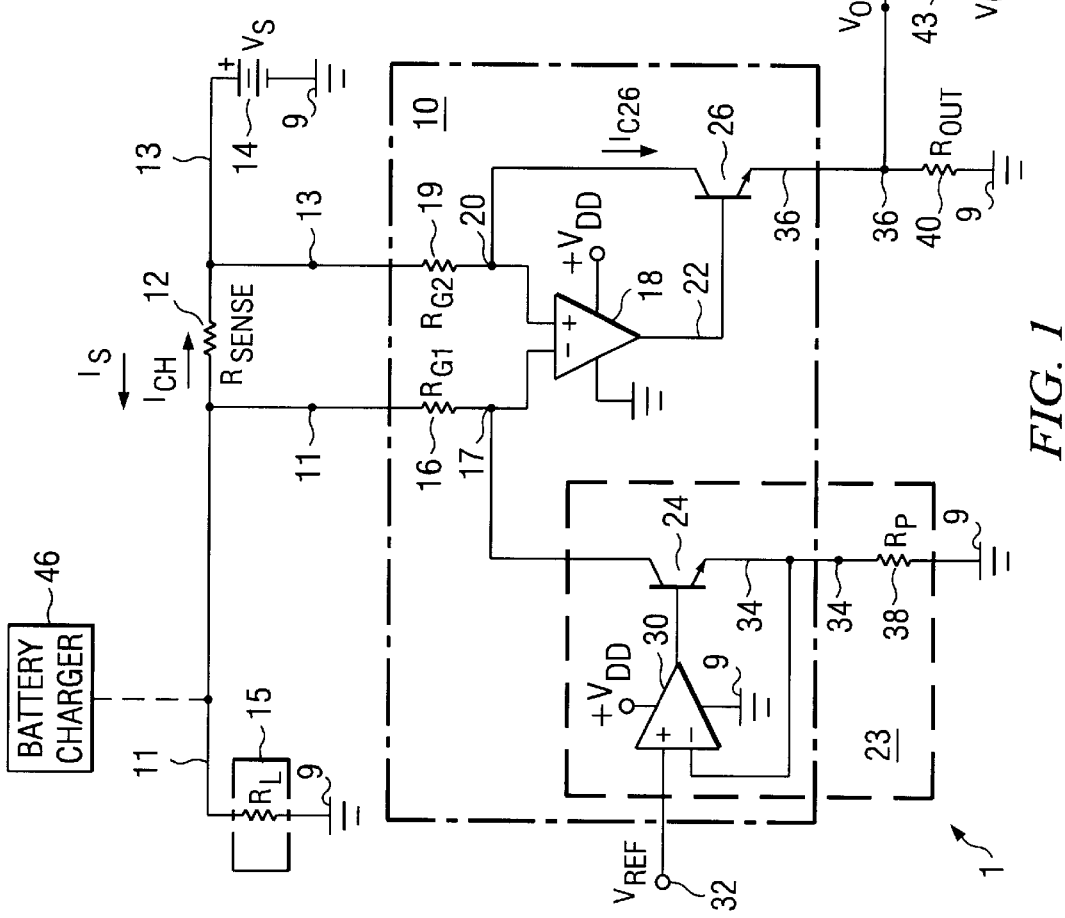
FIG. 1 is a schematic diagram of the high-side bidirectional current sense amplifier of the present invention.

Referring to FIG. 1, sense current measurement system 1 (which also can be referred to as "shunt current measurement system 1") includes a voltage source or battery 14 producing a supply voltage $V_S$ and applying it by means of conductor 13 to a first terminal of a current sense resistor 12 (which also can be referred to "shunt resistor 12") having a resistance $R_{SENSE}$. The second terminal of current sense resistor 12 is connected by conductor 11 to a first terminal of an electronic/electric load device or electronically/electrically controlled load device 15, which is illustrated as having an equivalent resistance $R_L$ represented by a resistor 15. Load device 15 can be an electronic/electric device or an electronically/electrically controlled device such as a motor. The second terminal of load device 15 is connected to a ground conductor 9. Battery 14 causes a battery current $I_S$ to flow in a first direction from conductor 13 through sense resistor 12 and conductor 11 to provide power to load device 15. A battery charger 46 can be connected to conductor 11 to cause a charging current $I_{CH}$ to flow in a second direction from conductor 11 through sense resistor 12 and conductor 13 to recharge battery 14. A high-side current sense amplifier 10 produces a voltage $V_{OUT}$ on conductor 36 which indicates both the amplitude and direction of the current flowing through sense resistor 12.

As subsequently explained, the amplitude of the current flowing through the sense resistor 12 is proportional to the difference between $V_{OUT}$ and an output of an offset voltage $V_{OFFSET}$, wherein $V_{OFFSET}$ is the voltage produced on conductor 36 when the current through sense resistor 12 is equal to zero. The direction of the current through sense resistor 12 is the direction of the battery current $I_S$ if $V_{OUT}$ is greater than $V_{OFFSET}$, and is in the direction of the charging current $I_{CH}$ if $V_{OUT}$ is less than $V_{OFFSET}$.

Current sense amplifier 10 has a first input terminal connected to conductor 11 and a second input terminal connected to conductor 13. Current sense amplifier 10 also has an output terminal 36 connected to one terminal of an output resistor 40 having a resistance $R_{OUT}$. The other terminal of output resistor 40 is connected to a ground conductor. Current sense amplifier 10 has a reference input terminal 32 connected to a reference voltage $V_{REF}$. Current sense amplifier 10 also has another terminal connected by conductor 34 to a first terminal of an external offset current setting resistor 38 of resistance $R_P$. A second terminal of offset current setting resistor 38 is connected to ground conductor 9.

Current sense amplifier 10 also includes a current source 23 which is shown within dashed lines. Current source 23 includes an operational amplifier 30, an NPN transistor 24, and the above mentioned offset current setting resistor 38, although various current sources could be utilized to establish the offset voltage $V_{OFFSET}$. Operational amplifier 30 has its (+) input connected to a reference voltage $V_{REF}$. The output 28 of amplifier 30 is connected to the base of an NPN transistor 24, the emitter of which is connected by conductor 34 to offset current setting resistor 38 and to the (−) input of amplifier 30. The collector of transistor 24 is connected by conductor 17 to the (−) input of an operational amplifier 18 and to one terminal of an input resistor 16 having a resistance $R_{G1}$. The other terminal of input resistor 16 is connected by conductor 11 to one terminal of sense resistor 12. The (+) input of amplifier 18 is connected by conductor 20 to one terminal of an input resistor 19 having a resistance $R_{G2}$. The other terminal of input resistor 19 is connected by conductor 13 to the other terminal of sense resistor 12 and also to the collector of an NPN feedback transistor 26 having its base connected by conductor 22 to the output of amplifier 18. The emitter of feedback transistor 26 is connected to output conductor 36.

Operational amplifiers 18 and 30 both have their supply voltage terminals connected to $+V_{DD}$ and ground conductor 9. Operational amplifier 30 can be an ordinary, inexpensive integrated circuit operational amplifier. However, operational amplifier is designed so that the common mode voltage on its (−) and (+) inputs can exceed $V_{DD}$. For example, in FIG. 1 the battery voltage could be +12 volts, and $V_{DD}$ can be +5 volts. A schematic diagram of operational amplifier 18 is shown in subsequently described FIG. 2.

$R_{G1}$ and $R_{G2}$ in FIG. 1 typically have equal, precisely matched resistances of approximately 1 kilohm. A typical value $R_{SENSE}$ of sense resistor 12 is 0.01 ohm. $R_P$ and $R_{OUT}$ typically have resistances of approximately 10 kilohms. If $R_P$ and $R_{OUT}$ are precisely matched, and $R_{G1}$ and $R_{G2}$ also are precisely matched, then the offset voltage $V_{OFFSET}$ produced on conductor 36 will be precisely equal to $V_{REF}$, which is convenient because the (−) input of differential analog-to-digital converter 42 can be connected directly to $V_{REF}$. Alternatively, the ratio of $R_P$ and $R_{OUT}$ can be adjusted to produce a desired value of the offset voltage on conductor 36 from a different value of $V_{REF}$.

Output conductor 36 can be connected to apply an output voltage $V_{OUT}$ representative of the magnitude and direction of the current through current sense resistor 12 to the (+) input of an analog input of a differential analog-to-digital converter 42, a (−) input of which is connected by means of conductor 43 to a reference voltage source producing a reference voltage equal to the output offset voltage $V_{OFFSET}$. Analog-to-digital converter 42 produces a digital output word representative of both the magnitude and direction of the current through current sense resistor 12. Analog-to-digital converter 42 converts the analog signal $V_{OUT}$ to a digital output word DIGITAL OUT. The word DIGITAL OUT represents the amplitude of the current through sense resistor 12, and the algebraic sign of the word DIGITAL OUT indicates the direction of flow of the current through sense resistor 12, i.e., the algebraic sign (+) or (−) of DIGITAL OUT indicates whether the battery 14 is supplying power to load device 15 or is being charged by battery charger 46. This configuration has the advantage that drift of $V_{REF}$ does not affect the value of $V_{OUT}$ or cause errors in the measured value of the amplitude or direction of the current flowing through sense resistor 12.

Figure 2:
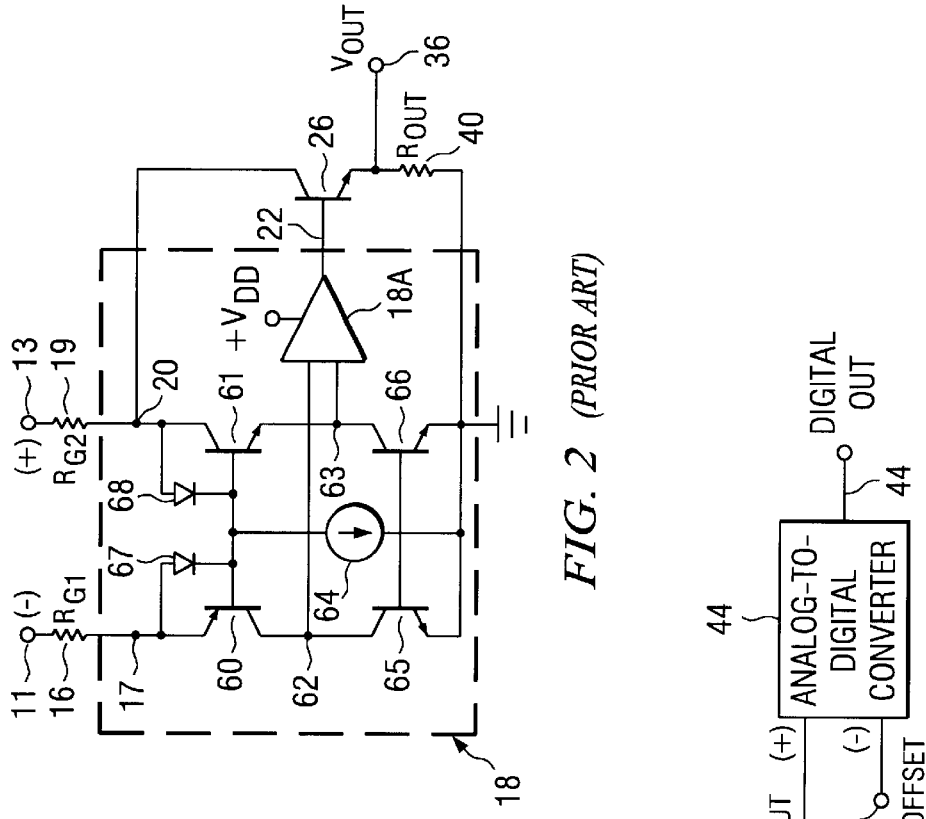
FIG. 2 is a schematic diagram of the operational amplifier 18 in FIG. 1.

Operational amplifier 18 can be the known operational amplifier circuit shown in FIG. 2, implemented as shown with PNP transistors 60 and 61, diodes 67 and 68, constant current source 64, and NPN transistors 65 and 66 forming an input stage, with amplifier circuitry 18A including the remaining stages. Conductors 11, 13, 17, 20, 22, and 36 are connected the same as in FIG. 1. Transistors 67 and 68 and current source 64 coact to bias transistors 60 and 61 on, and diode-connected transistor 65 and transistor 66 constitute a load circuit for the base-coupled input transistors 60 and 61. The amplifier circuitry 18A is coupled between $+V_{DD}$ and ground, and the common mode input voltage on conductors 17 and 20, and also on conductors 11 and 13, can be substantially greater than $+V_{DD}$ without damaging the remaining amplifier circuitry 18A. Thus, the architecture shown in FIG. 2 allows the circuitry to be designed so that the voltages on the (−) and (+) inputs of operational amplifier 18 may exceed $+V_{DD}$. A CMOS implementation of operational amplifier 18 also could be used.

Referring again to FIG. 1, battery 14 normally supplies battery current $I_S$ from conductor 13 through sense resistor 12 and conductor 11 to provide power to load device 15. The current $I_S$ supplied by battery 14 to load device 15 produces a voltage drop of $I_S R_S$ from conductor 11 across sense resistor 12 to conductor 13. When battery current $I_S$ is greater than zero, current sense amplifier 10 produces an analog value of $V_{OUT}$ which is greater than $V_{OFFSET}$. The difference between $V_{OUT}$ and $V_{OFFSET}$ represents the magnitude of the battery current $I_S$ supplied to load device 15 (plus the small amount of current required by current sense amplifier 10), and the (+) algebraic sign of the difference between $V_{OUT}$ and $V_{OFFSET}$ represents the direction of the battery current $I_S$ through sense resistor 12.

However, if battery charger 46 is coupled to conductor 11 to cause the charging current $I_{CH}$ to flow in the opposite direction from conductor 11 through sense resistor 12 and conductor 13 into the positive terminal of battery 14, then the output $V_{OUT}$ will be less than $V_{OFFSET}$, and the algebraic difference between $V_{OUT}$ and $V_{OFFSET}$ represents the amplitude of the charging current $I_{CH}$, and the (−) algebraic difference between $V_{OUT}$ and $V_{OFFSET}$ represents the opposite direction of $I_{CH}$.

In operation, amplifier 30 of constant current source 23 maintains conductor 34 at $V_{REF}$. Consequently, a constant current equal to $V_{REF}/R_P$ flows through the emitter and collector of transistor 24 and through input resistor 16, establishing a stable voltage on conductor 17 and the (−) input of operational amplifier 18. (It is assumed herein that the base currents of transistors 24 and 26 are negligible, so the collector current of each transistors is assumed to be equal to its emitter current.) Operational amplifier 18 operates a feedback loop from the output of operational amplifier 18 through transistor 26 to the (+) input of operational amplifier 22 to force the voltage of conductor 20 to be equal to the voltage on conductor 17, by driving transistor 26 so as to produce an amount of current through resistor 19 needed to maintain the voltage on conductor 20 equal to the voltage on conductor 17. The current flowing from conductor 13 through resistor 19 and transistor 26 also flows through resistor 40, thereby producing output offset voltage $V_{OUT}$ on output conductor 36.

If the current through resistor 12 is zero, then the output voltage on output conductor 36 is the offset voltage $V_{OFFSET}$. A reference voltage having a value $V_{OFFSET}$ could be applied to the (−) input of analog-to-digital converter 42.

If battery 14 supplies a non-zero current $I_S$ to load device 15 through shunt resistor 12, then the voltage on conductor 11 is less than the voltage on conductor 13, causing the voltage on conductor 17 to be reduced, since the voltage drop across resistor 16 is constant. The voltage of output 22 of operational amplifier 18 therefore increases, causing the emitter voltage of transistor 26 to increase. That increases $V_{OUT}$ and also increases the current through output resistor 40 and therefore also increases the current through transistor 26 and resistor 19, so as to cause the voltage of conductor 20 to equal to the voltage of conductor 17. The resulting difference between $V_{OUT}$ and $V_{OFFSET}$ represents the amplitude of $I_S$, and the fact that $V_{OUT}$ exceeds $V_{OFFSET}$ means that the direction of current flow through shunt resistor 12 is from right to left (as shown in FIG. 1).

However, if battery charger 46 supplies a non-zero charging current $I_{CH}$ to battery 14 through shunt resistor 12, then the voltage on conductor 11 is greater than the voltage on conductor 13. This causes the voltage on conductor 17 to be increased, and the voltage of output 22 of operational amplifier 18 therefore decreases, causing the emitter voltage of transistor 26 to decrease enough to cause the voltage of conductor 20 to be equal to the voltage of conductor 17. The resulting difference between $V_{OUT}$ and $V_{OFFSET}$ represents the amplitude of $I_S$, and the fact that $V_{OUT}$ is less than $V_{OFFSET}$ means that the direction of current flow through shunt resistor 12 is from left to right (as shown in FIG. 1).

The current flowing through transistor 26 is always substantial, so that a reliable, low-gain feedback loop is always provided between output 22 and the (+) input of operational amplifier 18. The low-gain feedback loop avoids the above mentioned inaccuracy of the measurement of the magnitude of low currents through sense resistor 12 caused by circuit in FIG. 5 of the Schaffer patent, and also avoids the above mentioned inaccuracy of the determination of the direction of very low currents flowing through the sense resistor of the Schaffer patent.

Figure 3:
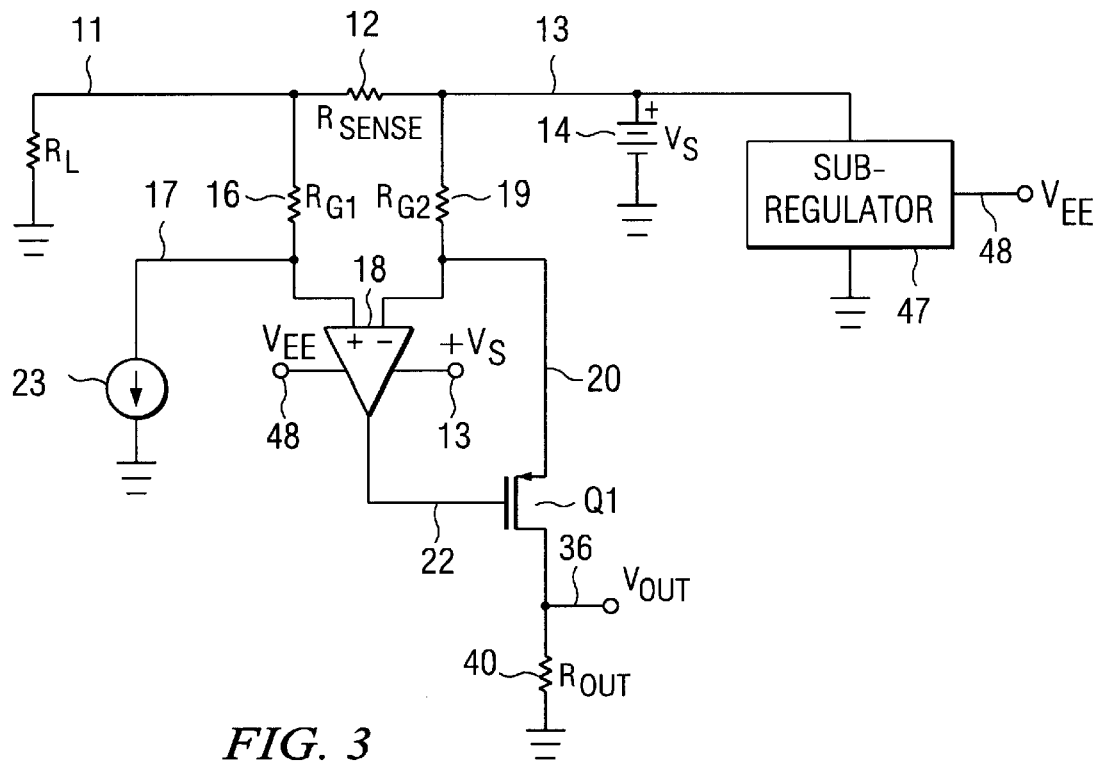
FIG. 3 is a schematic diagram of an alternative embodiment similar to that of FIG. 1 except that the feedback circuit functions differently.

FIG. 3 shows another embodiment of the invention that is similar to the current sense amplifier 1 shown in FIG. 1. Referring to FIG. 3, feedback transistor Q1 functions so the conductor 20, rather than output conductor 36, "follows" the voltage produced on conductor 22 by operational amplifier 18. Conductor 17 is connected to the (+) input of operational amplifier 18, and conductor 20 is connected to the (−) input thereof. To provide the circuit of FIG. 3, NPN transistor 26 of FIG. 1 has been replaced by a P-channel transistor Q1 having its source connected to conductor 20, its gate connected to operational amplifier output conductor 22, and its drain connected to output conductor 36. (Alternatively, NPN transistor 26 of FIG. 1 can be replaced by a PNP transistor having its emitter connected to conductor 20, its base connected to conductor 22, and its collector connected to conductor 36.) Transistor Q1 therefore functions as a source follower, so the feedback voltage produced on conductor 20 directly follows the output 22 of operational amplifier 18, unlike the circuitry in FIG. 1 wherein the feedback signal is inverted relative to the output 22 of operational amplifier 18. (Alternatively, feedback transistor Q1 could instead be a PNP transistor having its emitter connected to conductor 20, its base connected conductor 22, and its collector connected to conductor 36.) The voltage source 14 produces $V_S$ volts on conductor 13. Conductor 13 is connected to the $V_{DD}$ terminal of operational amplifier 18. Optionally, a low voltage sub-regulator circuit 45 is coupled between conductor 13 and ground, and produces an above-ground voltage $V_{EE}$ on conductor 48, which is connected to the lower supply voltage terminal of operational amplifier 18. This allows operational amplifier 18 to be a low voltage device that is powered by a voltage difference less than $V_S$.

Thus, the current sense amplifiers shown in FIGS. 1 and 3 permit very precise measurement of very small sense currents flowing in either direction through current sense resistor 12, and also provides an accurate indication of the direction of the very small sense currents. The output offset voltage technique used in the current sense amplifier of FIG. 1 eliminates the circuit complexity associated with the use of two operational amplifiers and a comparator as required in the closest prior art, and also eliminates the additional terminal required to indicate the direction of current through the current sense resistor 12. The measurement accuracy when the sense current is nearly zero is substantially improved over the prior art. If the current through sense resistor 12 is zero, then the output $V_{OUT}$ is exactly equal to the offset voltage, which is the system "zero". This is in contrast to the circuit shown in FIG. 5 of the Schaffer patent, because in FIG. 5 of the Schaffer patent, if the current through the sense resistor is very low or zero, then $V_{OUT}$ is as close to ground as is achievable, but that value of $V_{OUT}$ is quite inaccurate and therefore cannot accurately represent the current through the sense resistor 12. Furthermore, the output offset voltage $V_{OFFSET}$ can be generated using the same reference voltage $V_{REF}$ as the system analog-to-digital converter, which makes the output offset voltage $V_{OFFSET}$ ratiometric.

Figure 4:
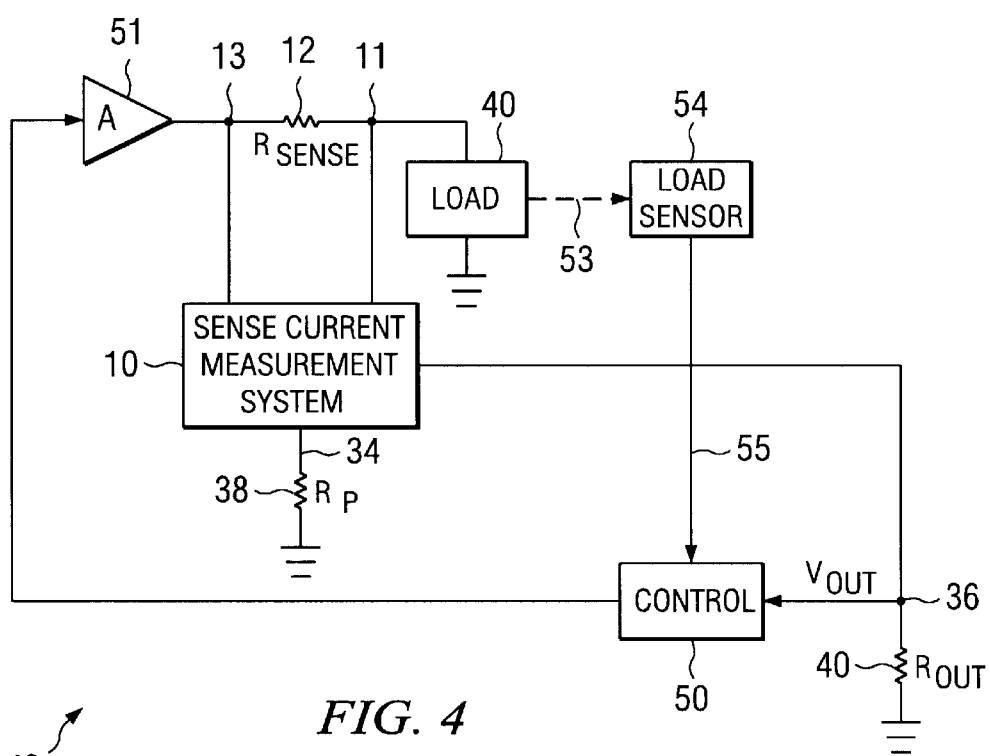
FIG. 4 is a block diagram of the current sense amplifier of FIG. 1 connected to measure current in a feedback control loop.

Referring to FIG. 4, a control system 49 includes a load circuit/device 15 coupled between ground and a control conductor 11. Sense resistor 12 is connected between conductor 11 and conductor 13. The (−) and (+) inputs of the sense current measurement system 10 of FIG. 1 are connected to conductors 11 and 13, respectively (although these connections could be reversed). Conductor 13 is connected to the output of a conventional servo amplifier 51. The input of servo amplifier 51 is connected to the output of a control circuit 50, one input of which is connected by conductor 36 to the output voltage $V_{OUT}$ produced by sense current measurement system 10. Another input of control circuit 50 is connected to the output 55 of a load sensing circuit 54, which is coupled as indicated by dashed line 53 to measure the performance of load system 15, which could be an electrical motor or any other controllable load device. As in FIG. 1, sense current measurement system 10 is connected by output conductor 36 to one terminal of output resistor 40, the other terminal of which is connected to ground. Offset current setting resistor 38 is connected between conductor 34 and ground. Thus, current sense resistor 12 and sense current measurement system 10 may be connected to sense a feedback control current in a control loop of a control system to effectuate control of the loop.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, an all-CMOS implementation could be utilized. Other supply voltages than $V_{DD}$ and ground could, of course, be used. For example, although a high side current sense amplifier configuration is shown in FIGS. 1 and 3, essentially the same circuitry can be configured as a low side current sense amplifier. This can be accomplished by sensing across a shunt resistor connected in the series with the ground conductor, replacing NPN transistor 26 with a PNP transistor, modifying the input structure of operational amplifier 18 to enable the input thereof to operate at ground (rather than $V_S$), and reversing the direction of the offsetting current flowing through resistor 16.

What is claimed is:

1. A current sense amplifier for measuring a current flowing through a sense resistor coupled between first and second input terminals, respectively, of the current sense amplifier, the current sense amplifier comprising:

(a) a first amplifier having a first input coupled by a first resistor to the first terminal and a second input coupled by a second resistor to the second terminal;

(b) a current source coupled to the first input of the first amplifier for causing a bias current to flow through the first resistor;

(c) a feedback circuit coupled to an output of the first amplifier and the second input of the first amplifier for causing a feedback current to flow through the second resistor to equalize voltages on the first and second inputs of the first amplifier and supplying the feedback current to an output terminal of the current sense amplifier.

2. The current sense amplifier of claim 1 wherein the current source includes a second amplifier having a first input coupled to a reference voltage, an output coupled a control electrode of a first transistor, the first transistor having a first electrode coupled to the first input of the first amplifier, and a second electrode coupled to a second input of the second amplifier and to an offset current setting resistor, and the feedback circuit includes a second transistor having a control electrode coupled to the output of the first amplifier, a first electrode coupled to the second input of the first amplifier, and a second electrode coupled to the output terminal.

3. The current sense amplifier of claim 2 wherein the first and second transistors are NPN transistors, and the control electrodes, first electrodes, and second electrodes are base electrodes, collector electrodes, and emitter electrodes, respectively.

4. The current sense amplifier of claim 3 wherein the output terminal is connected to an input of an analog-to-digital converter having an output for conducting a digital output signal representative of both the amplitude and direction of the current flowing through the sense resistor.

5. The current sense amplifier of claim 4 wherein
if no current flows through the sense resistor, and output voltage on the output terminal is equal to an output offset voltage, and
wherein if a current does flow through the sense resistor, the difference between the output voltage and the output offset voltage represents the magnitude of the current, the difference being positive if the current flows in a first direction through the sense resistor and negative if the current flows in a second direction through the sense resistor.

6. A current sense amplifier for measuring a current flowing through a sense resistor coupled between first and second input terminals, respectively, of the current sense amplifier, the current sense amplifier comprising:
(a) a first amplifier having a first input coupled by a first resistor to the first terminal and a second input coupled by a second resistor to the second terminal;
(b) a bias circuit coupled to the first input of the first amplifier for causing a bias current to flow through the first resistor;
(c) a feedback circuit coupled to the output of the first amplifier and the second input of the first amplifier for causing a feedback current to flow through the second resistor to equalize voltages on the first and second inputs of the first amplifier and supplying the feedback current to an output terminal of the current sense amplifier.

7. The current sense amplifier of claim 6 when the first input terminal is coupled to a load device and the second input terminal is coupled to a voltage source which supplies the current through the sense resistor to the load device.

8. The current sense amplifier of claim 6 wherein the feedback circuit causes the feedback current to flow through the output terminal and an output resistor having a first terminal connected to the output terminal and a second terminal connected to a first reference voltage conductor to produce an output voltage on the output terminal.

9. The current sense amplifier of claim 6 wherein the feedback circuit includes a transistor having a control electrode coupled to the output of the first amplifier, a first electrode coupled to the second input of the first amplifier, and a second electrode coupled to the output terminal.

10. The current sense amplifier of claim 9 wherein the transistor is a bipolar transistor, and wherein the control electrode is a base electrode, the first electrode is a collector electrode, and the second electrode is an emitter electrode.

11. The current sense amplifier of claim 10 wherein the transistor is an NPN transistor.

12. The current sense amplifier of claim 6 wherein the bias circuit includes a second amplifier having a first input coupled to a reference voltage, an output coupled a control electrode of a transistor, the transistor having a first electrode coupled to the first input of the first amplifier, and a second electrode coupled to a second input of the second amplifier and to a current source.

13. The current sense amplifier of claim 12 wherein the transistor is a bipolar transistor, and wherein the control electrode is a base electrode, the first electrode is a collector electrodes, and the second electrode is an emitter electrode.

14. The current sense amplifier of claim 13 wherein the transistor is an NPN transistor.

15. The current sense amplifier of claim 6 wherein the feedback circuit causes the feedback current to flow through the output terminal and an output resistor having a first terminal connected to the output terminal and a second terminal connected to a first supply voltage conductor to produce an output voltage on the output terminal, and wherein the feedback circuit includes a first transistor having a control electrode coupled to the output of the first amplifier, a first electrode coupled to the second input of the first amplifier, and a second electrode coupled to the output terminal, and wherein the bias circuit includes a second amplifier having a first input coupled to a reference voltage, an output coupled a control electrode of a second transistor, the second transistor having a first electrode coupled to the first input of the first amplifier, and a second electrode coupled to a second input of the second amplifier and to a current source, and wherein the resistance of the first resistor is closely matched to the resistance of the second resistor.

16. The current sense amplifier of claim 15 wherein the current source includes an offset current setting resistor coupled between the second electrode of the second transistor and the first supply voltage conductor, and wherein the resistance of the offset current setting resistor is closely matched to the resistance of the output resistor, causing the output offset voltage to be precisely equal to the reference voltage.

17. The current sense amplifier of claim 16 wherein
i. if no current flows through the sense resistor, an output voltage produced on the output terminal is equal to an output offset voltage, and
ii. wherein if a current does flow through the sense resistor, the difference between the output voltage and the output offset voltage represents the magnitude of the current, the difference being positive if the current flows in a first direction through the sense resistor and negative if the current flows in a second direction through the sense resistor, and
iii. wherein the output terminal is connected to a first input of a differential analog-to-digital converter having an output for conducting a digital output signal representative of both the amplitude and direction of the current flowing through the sense resistor, and
iv. a second input of the differential analog-to-digital converter is connected to the reference voltage.

18. The current sense amplifier of claim 6 wherein the output terminal is connected to an input of an analog-to-digital converter having an output for conducting a digital output signal representative of both the amplitude and direction of the current flowing through the sense resistor.

19. The current sense amplifier of claim 6 wherein
   i. if no current flows through the sense resistor, and output voltage on the output terminal is equal to an output offset voltage, and
   ii. wherein if a current does flow through the sense resistor, the difference between the output voltage and the output offset voltage represents the magnitude of the current, the difference being positive if the current flows in a first direction through the sense resistor and negative if the current flows in a second direction through the sense resistor.

20. The current sense amplifier of claim 19 wherein the output terminal is connected to an input of an analog-to-digital converter having an output for conducting a digital output signal representative of both the amplitude and direction of the current flowing through the sense resistor.

21. The current sense amplifier of claim 7 wherein the voltage source includes a rechargeable battery, and wherein a battery charger is coupled to the first input terminal for producing a charging current flowing through the current sense resistor in the direction opposite to the flow of current supplied by the voltage source to the load device.

22. A method of measuring a current flowing through a sense resistor having first and second input terminals, comprising:
   (a) causing a bias current to flow through a first resistor having a first terminal coupled to the first terminal of the sense resistor to produce a first voltage on a first input of a first amplifier;
   (b) operating a feedback circuit having a first terminal coupled to an output of the first amplifier and a second terminal coupled to a second input of the first amplifier to cause a feedback current to flow through a second resistor having a first terminal coupled to the second input of the first amplifier and a second terminal coupled to the second terminal of the sense resistor to equalize voltages on the first and second inputs of the first amplifier; and
   (c) operating the feedback circuit to supply the feedback current through a third terminal of the feedback circuit to an output resistor through an output terminal conducting an output voltage.

23. A method of measuring a current flowing through a sense resistor having first and second input terminals, comprising:
   (a) causing a bias current to flow through a first resistor having a first terminal coupled to the first terminal of the sense resistor to produce a first voltage on a first input of a first amplifier;
   (b) operating a feedback circuit having a first terminal coupled to an output of the first amplifier and a second terminal coupled to a second input of the first amplifier to cause a feedback current to flow through a second resistor having a first terminal coupled to the second input of the first amplifier and a second terminal coupled to the second terminal of the sense resistor to equalize voltages on the first and second inputs of the first amplifier;
   (c) operating the feedback circuit to supply the feedback current through a third terminal of the feedback circuit to an output resistor through an output terminal conducting an output voltage; and
   (d) wherein if no current flows through the sense resistor, performing steps (a) through (c) causes output voltage to be equal to an output offset voltage.

24. A method of measuring a current flowing through a sense resistor having first and second input terminals, comprising:
   (a) causing a bias current to flow through a first resistor having a first terminal coupled to the first terminal of the sense resistor to produce a first voltage on a first input of a first amplifier;
   (b) operating a feedback circuit having a first terminal coupled to an output of the first amplifier and a second terminal coupled to a second input of the first amplifier to cause a feedback current to flow through a second resistor having a first terminal coupled to the second input of the first amplifier and a second terminal coupled to the second terminal of the sense resistor to equalize voltages on the first and second inputs of the first amplifier;
   (c) operating the feedback circuit to supply the feedback current through a third terminal of the feedback circuit to an output resistor through an output terminal conducting an output voltage;
   (d) wherein if no current flows through the sense resistor, performing steps (a) through (c) causes output voltage to be equal to an output offset voltage; and
   (e) wherein if the current flows through the sense resistor, performing steps (a) through (c) causes the difference between the output voltage and the output offset voltage to be representative of the magnitude of the current, the difference being positive if the current flows in a first direction through the sense resistor and negative if the current flows in a second direction through the sense resistor.

25. The method of claim 24 including coupling the output terminal is connected to a first input of a differential analog-to-digital converter to produce a digital output word including a sign bit representative of the direction of the current flowing through the sense resistor, the digital output word also representing the magnitude of the current flowing through the sense resistor.

26. The method of claim 25 including applying a reference voltage equal to the output offset voltage to a second input of the differential analog-to-digital converter.

27. The method of claim 24 wherein step (a) includes applying a reference voltage to a first input of a second amplifier, applying an output voltage of the second amplifier to a control electrode of a first transistor, applying a voltage on a first electrode of the first transistor to the second input of the second amplifier, causing a current flowing through the first transistor to flow through the first electrode of the first transistor and through an offset setting resistor, and causing the current flowing through the first transistor to also flow through a second electrode of the first transistor to provide the bias current.

28. A circuit for measuring a current flowing through a sense resistor having first and second input terminals, comprising:
   (a) means for causing a bias current to flow through a first resistor having a first terminal coupled to the first terminal of the sense resistor to produce a first voltage on a first input of a first amplifier;
   (b) feedback means, including a first terminal coupled to an output of the first amplifier and a second terminal coupled to a second input of the first amplifier, for causing a feedback current to flow through a second resistor having a first terminal coupled to the second input of the first amplifier and a second terminal coupled to the second terminal of the sense resistor to equalize voltages on the first and second inputs of the first amplifier;

(c) means for causing a current equal to the feedback current to flow through the through an output terminal conducting an output voltage and an output resistor;

(d) wherein if no current flows through the sense resistor, elements (a) through (c) coact to cause the output voltage to be equal to an output offset voltage; and (e) wherein if the current flows through the sense resistor, elements (a) through (c) coact to cause the difference between the output voltage and the output offset voltage to be representative of the magnitude of the current, the difference being positive if the current flows in a first direction through the sense resistor and negative if the current flows in a second direction through the sense resistor.

29. A method of measuring and controlling a current flowing through a sense resistor in a feedback loop, the sense resistor having first and second input terminals, comprising:

(a) causing a bias current to flow through a first resistor having a first terminal coupled to the first terminal of the sense resistor to produce a first voltage on a first input of a first amplifier;

(b) operating a feedback circuit having a first terminal coupled to an output of the first amplifier and a second terminal coupled to a second input of the first amplifier to cause a feedback current to flow through a second resistor having a first terminal coupled to the second input of the first amplifier and a second terminal coupled to the second terminal of the sense resistor to equalize voltages on the first and second inputs of the first amplifier;

(c) operating the feedback circuit to supply the feedback current through a third terminal of the feedback circuit to an output resistor through an output terminal conducting an output voltage;

(d) wherein if no current flows through the sense resistor, performing steps (a) through (c) causes output voltage to be equal to an output offset voltage;

(e) wherein if the current flows through the sense resistor, performing steps (a) through (c) causes the difference between the output voltage and the output offset voltage to be representative of the magnitude of the current, the difference being positive if the current flows in a first direction through the sense resistor and negative if the current flows in a second direction through the sense resistor; and (f) adjusting the current through the sense resistor in response to the output voltage.

* * * * *